(12) United States Patent
Posamentier

(10) Patent No.: US 7,304,575 B2
(45) Date of Patent: Dec. 4, 2007

(54) LOW COST POWER AMPLIFIER LINEARIZATION IN AN RFID RADIO TRANSMIT CHAIN

(75) Inventor: Joshua Posamentier, Oakland, CA (US)

(73) Assignee: Intel Corporation, Santa Clara, CA (US)

( * ) Notice: Subject to any disclaimer, the term of this patent is extended or adjusted under 35 U.S.C. 154(b) by 407 days.

(21) Appl. No.: 11/142,117

(22) Filed: Jun. 1, 2005

(65) Prior Publication Data

US 2006/0273900 A1 Dec. 7, 2006

(51) Int. Cl.
*G08B 13/14* (2006.01)

(52) U.S. Cl. .................... 340/572.1; 340/10.3

(58) Field of Classification Search ............. 340/572.1, 340/572.4, 572.2, 10.3, 10.1, 10.33, 10.31, 340/10.51, 10.2, 568.1, 538.11, 538.15
See application file for complete search history.

(56) References Cited

U.S. PATENT DOCUMENTS 6,369,710 B1 * 4/2002 Poticny et al. ........... 340/572.1
7,030,761 B2 * 4/2006 Bridgelall et al. ....... 340/572.2
7,148,804 B2 * 12/2006 Salesky et al. .......... 340/572.4

* cited by examiner

*Primary Examiner*—Anh V. La
(74) *Attorney, Agent, or Firm*—The Law Offices of John C. Scott, LLC; John C. Scott

(57) ABSTRACT

A power amplification system within an RFID reader uses feedback to linearize a transfer function of the system. ASK modulation is used in the system. An envelope of an output signal of a non-linear power amplifier is fed back to an input where it is combined in an integrator with an ASK modulation signal to generate a pre-emphasized modulation signal. The pre-emphasized modulation signal is then applied to the power amplifier to generate a linearized output signal.

23 Claims, 3 Drawing Sheets

LOW COST POWER AMPLIFIER LINEARIZATION IN AN RFID RADIO TRANSMIT CHAIN

TECHNICAL FIELD

The invention relates generally to radio frequency identification (RFID) systems and, more particularly, to power amplifiers within RFID readers.

BACKGROUND OF THE INVENTION

An RFID tag is a radio frequency (RF) transponder device that is designed to transmit a signal back to a reader device in response to an interrogation signal received from the reader device. RFID tags are currently used in a wide variety of applications including, for example, pallet tracking, inventory tracking, airport baggage tracking, tracking of pets, item identification, personnel identification (e.g., ID badges), and many others. A form of amplitude modulation known as amplitude shift keying (ASK) is often used to modulate a carrier to form the interrogation signal. The RFID reader device will typically include a power amplification system to amplify an interrogation signal before transmission. It is generally desirable that the power amplification system used by the reader device be relatively linear in operation. It is also desirable that the amplification system operate efficiently.

DETAILED DESCRIPTION

Figure 1:
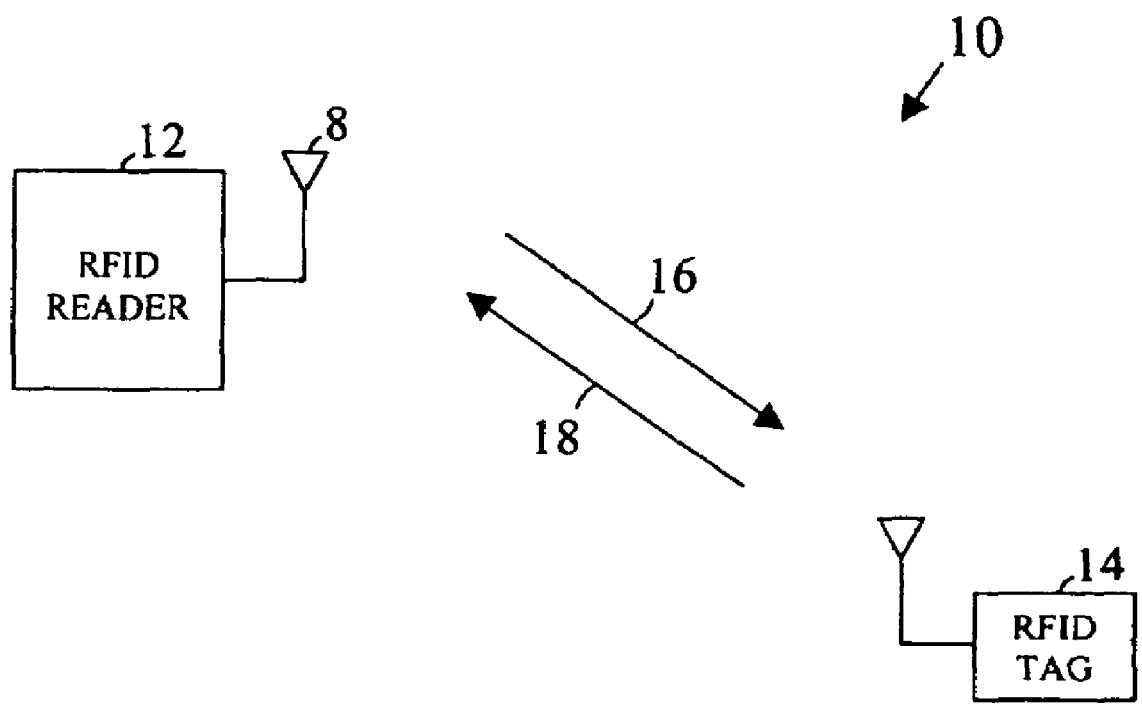
FIG. 1 is a diagram illustrating an arrangement that may be used for reading an RFID tag in accordance with an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 is a diagram illustrating an arrangement 10 that may be used for reading an RFID tag in accordance with an embodiment of the present invention. When an RFID reader device 12 (or a user thereof) wishes to retrieve information from an RFID tag 14, the reader 12 first transmits a wireless interrogation signal 16 to the RFID tag 14. If within range of the reader 12, the RFID tag 14 transmits a wireless response signal 18 back to the reader 12. The wireless response signal 18 will typically include some information of interest to the reader 12. For example, the response signal 18 may include information identifying a product on which the RFID tag 14 is affixed (e.g., an electronic product code™ or EPC, etc.). In another application, the response signal 18 may include information identifying the contents of a container on which the tag 14 is affixed. Many other RFID applications also exist. The interrogation signal 16 typically includes a form of amplitude modulation known as amplitude shift keying (ASK). ASK modulation involves changing the magnitude of a carrier signal between two or more discrete values to impart information to the signal. For example, in one possible approach, a carrier wave may be modulated between magnitudes of one and zero to implement ASK. To generate a quality interrogation signal using ASK modulation, a power amplifier must be capable of operating in a relatively linear fashion. Otherwise, the signal output by the power amplifier may be distorted, which can seriously impair RFID tag operation.

As shown in FIG. 1, the RFID reader 12 may include one or more antennas 8 for use in transmitting interrogation signals and/or receiving response signals. Any type of antenna(s) may be used including, for example, a dipole, a patch, a helical antenna, and/or others. The RFID tag 14 may also include one or more antennas.

Figure 2:
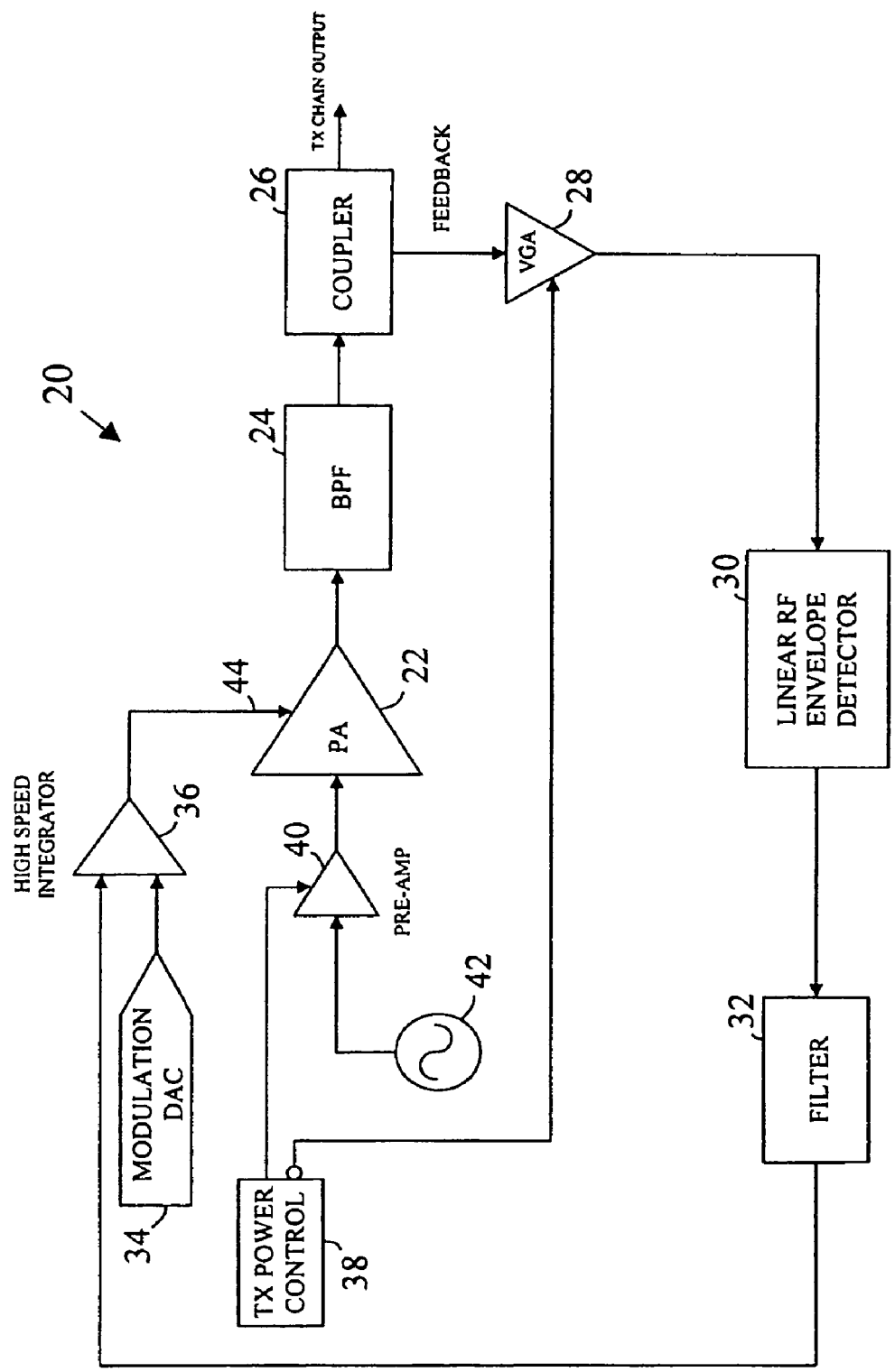
FIG. 2 is a block diagram illustrating an example power amplification system in accordance with an embodiment of the present invention.

FIG. 2 is a block diagram illustrating an example power amplification system 20 in accordance with an embodiment of the present invention. The power amplification system 20 may be used within, for example, the RFID reader 12 of FIG. 1 or in other RFID reader devices. The power amplification system 20 may also be used in other ASK-based applications that do not involve RFID technology. As shown, the power amplification system 20 includes: a power amplifier (PA) 22, a band pass filter 24, a coupler 26, a variable gain amplifier (VGA) 28, a linear radio frequency (RF) envelope detector 30, a filter 32, a modulation digital-to-analog converter (DAC) 34, a high speed integrator 36, a transmit power control unit 38, a signal source 42, and a preamplifier 40. The power amplifier 22 is a non-linear power amplifier. For example, the power amplifier 22 may be a class-C amplifier, a class-E amplifier, or some other form of amplifier with a non-linear transfer function. Non-linear amplifiers are known to operate more efficiently than linear amplifiers. However, the shape of the output signal of a non-linear amplifier will typically be different from the shape of the input signal. In the power amplification system 20 of FIG. 2, as will be described in greater detail, feedback is used to linearize the overall transfer function of the system.

The signal source 42 provides the carrier signal to be amplified by the power amplification system 20. The preamplifier 40 is a linear amplifier having a variable gain that is used to amplify the carrier signal before it reaches the PA 22. The preamplifier 40 allows transmit power control to be implemented without having to adjust the gain of the PA 22. As shown, the transmit power control unit 38 controls the gain of the preamplifier 40. Thus, the transmit power control unit 38 can achieve a desired transmit power level by adjusting the gain of the preamplifier 40. The PA 22 amplifies the signal received from the preamplifier 40 to generate an amplified output signal. As will be described in greater detail, the PA 22 receives a modulation signal at a modulation input 44 which the PA 22 uses to modulate the signal being amplified.

The BPF 24 is used to filter the output signal of the PA 22 before it is transmitted to its destination. The coupler 26 is used to divert a small fraction of the output signal for use as a feedback signal in the system 20. Any device, circuit, or component that is capable a diverting a portion of a signal may be used as the coupler 26 (e.g., a directional coupler, a hybrid coupler, resistive or matched asymmetrical power splitter, etc.). The remainder of the output signal may be allowed to proceed through the coupler 26 to a transmit chain output (e.g., to a transmit antenna, etc.). The feedback signal output by the coupler 26 may be processed in the VGA 28, the gain of which may also be controlled by the transmit power control unit 38. In at least one embodiment, the transmit power control unit 38 causes the gain of the VGA 28 to be inversely proportional to (e.g., the reciprocal of) the gain of the preamplifier 40. The purpose of this is to allow the transmit power control 38 to vary the overall output power of the system 20, while nullifying the effect of the change in output power within the feedback loop. In at least one embodiment, the amplification system 20 is implemented without the VGA 28.

The envelop detector 30 detects the envelope of the feedback signal. An optional filter 32 (e.g., a low pass filter (LPF), BPF, etc.) may be used in the feedback loop to filter the detected envelope. The envelope signal is then directed to the high speed integrator 36. The high speed integrator 36 processes the envelope signal along with the desired ASK modulation signal output by the modulation DAC 34. The high speed integrator 36 integrates the envelope signal and the modulation signal to develop a modified modulation signal that includes pre-emphasis to deal with non-linearities in the PA 22. The pre-emphasized modulation signal is delivered to the modulation input 44 of the PA 22, resulting in a linearized output signal.

The envelope detector 30 may be designed in a conventional manner using, for example, diodes (Shottky, PIN, etc.) and resistors. The envelope detector 30 should be capable of relatively high speed operation (e.g., at least 3 MHz baseband bandwidth in one implementation). The integrator 36 may be implemented using any component that is capable of performing integration at the requisite speed. In one implementation, for example, the integrator has a bandwidth specification of more than ten times the modulation symbol rate. In at least one embodiment, a high bandwidth instrumentation amplifier is used as the integrator 36. Stand alone RF power detector chips may also be used to achieve a lower component count design. Such chips are available from Linear Technology Corporation, Analog Devices, Inc., National Semiconductor, and others. Other forms of integrator may alternatively be used. In at least one embodiment, some or all of the power amplification system 20 is integrated onto a single semiconductor chip. The chip may then be coupled to an antenna for use as a reader device. Receive circuitry may also be located on the chip (or on another semiconductor chip). Implementations using discrete components and a combination of discrete elements and integrated circuits may also be used.

Figure 3:
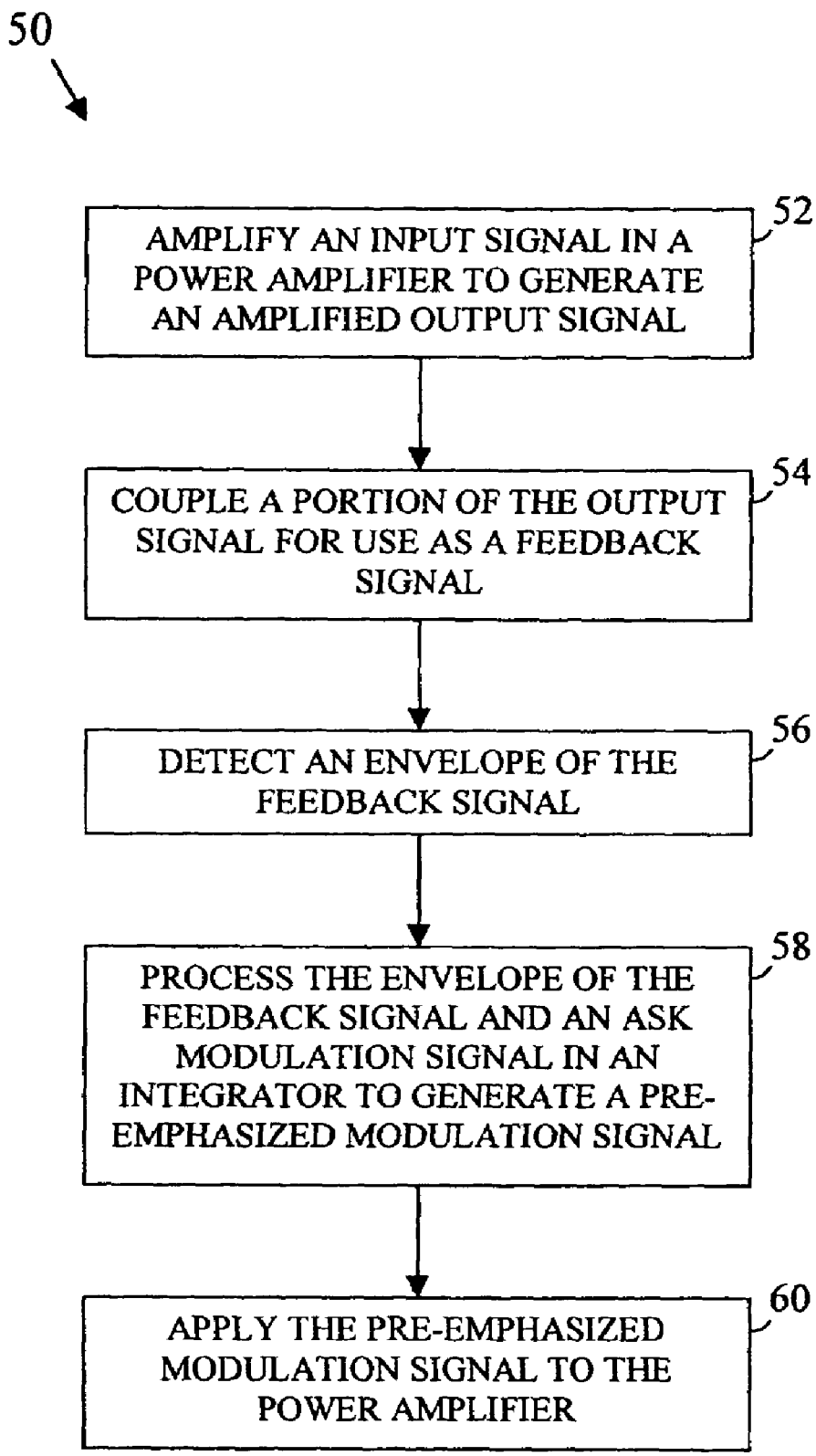
FIG. 3 is a flowchart illustrating an example method for use in linearizing the response of a power amplifier in an RFID reader that uses ASK modulation in accordance with an embodiment of the present invention.

FIG. 3 is a flowchart illustrating an example method 50 for use in linearizing the response of a power amplifier in an RFID reader that uses ASK modulation in accordance with an embodiment of the present invention. The power amplifier amplifies an input signal to generate an amplified output signal (block 52). A portion of the output signal is coupled for use as a feedback signal (block 54). An envelope of the feedback signal is then detected (block 56). The envelope and an ASK modulation signal are then applied to an integrator to generate a pre-emphasized modulation signal (block 58). The pre-emphasized modulation signal is then applied to the power amplifier (block 60). By using pre-emphasis within the modulation signal, the nonlinear portions of the power amplifier output signal can be significantly reduced.

In the foregoing detailed description, various features of the invention are grouped together in one or more individual embodiments for the purpose of streamlining the disclosure. This method of disclosure is not to be interpreted as reflecting an intention that the claimed invention requires more features than are expressly recited in each claim. Rather, as the following claims reflect, inventive aspects may lie in less than all features of each disclosed embodiment.

Although the present invention has been described in conjunction with certain embodiments, it is to be understood that modifications and variations may be resorted to without departing from the spirit and scope of the invention as those skilled in the art readily understand. Such modifications and variations are considered to be within the purview and scope of the invention and the appended claims.

What is claimed is:

1. An apparatus for use in an RFID reader, comprising:
a power amplifier having a non-linear transfer function, said power amplifier to generate an output signal;
a coupler to couple a portion of said output signal for use as a feedback signal;
an envelope detector to detect an envelope of said feedback signal; and
a high speed integrator to process said envelope of said feedback signal and an amplitude shift keying (ASK) modulation signal to generate a pre-emphasized modulation signal for delivery to said power amplifier, said pre-emphasized modulation signal to linearize the operation of said power amplifier.

2. The apparatus of claim 1, wherein:
said power amplifier is a class C amplifier.

3. The apparatus of claim 1, wherein:
said power amplifier is a class E amplifier.

4. The apparatus of claim 1, further comprising:
a linear preamplifier to amplify an input signal before it reaches said power amplifier.

5. The apparatus of claim 4, further comprising:
a variable gain amplifier to amplify said feedback signal before it reaches said envelope detector.

6. The apparatus of claim 5, further comprising:
a transmit power control unit to control a gain of said linear preamplifier.

7. The apparatus of claim 6, wherein:
said transmit power control unit is also to control a gain of said variable gain amplifier, wherein said transmit power control unit is to cause said gain of said variable gain amplifier to be inversely proportional to said gain of said linear preamplifier.

8. The apparatus of claim 1, further comprising:
a bandpass filter in a signal path between said power amplifier and said coupler.

9. The apparatus of claim 1, further comprising:
a filter in a signal path between said envelope detector and said high speed integrator.

10. The apparatus of claim 1, wherein:
said high speed integrator has a bandwidth specification of more than ten times the modulation symbol rate.

11. A method for use in connection with an RFID reader, comprising:
- amplifying an input signal in a power amplifier to generate an output signal;
- coupling a portion of said output signal for use as a feedback signal;
- detecting an envelope of said feedback signal;
- combining said envelope with an amplitude shift keying (ASK) modulation signal to achieve a pre-emphasized modulation signal; and
- applying said pre-emphasized modulation signal to said power amplifier.

12. The method of claim 11, wherein:
said power amplifier is a class-C power amplifier.

13. The method of claim 11, wherein:
said power amplifier is a class-E power amplifier.

14. The method of claim 11, wherein:
combining includes applying said envelope and said ASK modulation signal to corresponding inputs of a high speed integrator circuit.

15. The method of claim 11, further comprising:
pre-amplifying said input signal before amplifying said input signal in said power amplifier.

16. The method of claim 15, further comprising:
amplifying said feedback signal before it is input to said envelope detecting, wherein amplifying said feedback signal includes amplifying said feedback signal by a gain that is inversely proportional to a gain used to pre-amplify said input signal.

17. The method of claim 11, further comprising:
bandpass filtering said output signal before coupling.

18. The method of claim 11, further comprising:
filtering said envelope before combining.

19. An RFID reader, comprising:
- at least one dipole antenna;
- a power amplifier having a non-linear transfer function, said power amplifier to generate an output signal, wherein an output of said power amplifier is in communication with said at least one dipole antenna;
- a coupler to couple a portion of said output signal for use as a feedback signal;
- an envelope detector to detect an envelope of said feedback signal; and
- a high speed integrator to process said envelope of said feedback signal and an ASK modulation signal to generate a pre-emphasized modulation signal for delivery to said power amplifier, said pre-emphasized modulation signal to linearize the operation of said power amplifier.

20. The RFID reader of claim 19, further comprising:
a linear preamplifier to amplify an input signal before it reaches said power amplifier.

21. The RFID reader of claim 20, further comprising:
a variable gain amplifier to amplify said feedback signal before it reaches said envelope detector.

22. The RFID reader of claim 21, further comprising:
a transmit power control unit to control a gain of said linear preamplifier.

23. The RFID reader of claim 22, wherein:
said transmit power control unit is also to control a gain of said variable gain amplifier, wherein said transmit power control unit is to cause said gain of said variable gain amplifier to be inversely proportional to said gain of said linear preamplifier.

* * * * *